United States Patent
Yao et al.

(10) Patent No.: US 11,196,399 B2
(45) Date of Patent: Dec. 7, 2021

(54) SIGNAL PROCESSING METHOD, SIGNAL PROCESSING DEVICE AND SIGNAL PROCESSING SYSTEM

(71) Applicant: Shanghai Awinic Technology Co., LTD, Shanghai (CN)

(72) Inventors: Wei Yao, Shanghai (CN); Songying Jiang, Shanghai (CN); Ma Zhu, Shanghai (CN); Liming Du, Shanghai (CN)

(73) Assignee: Shanghai Awinic Technology Co., LTD, Shanghai (CN)

( * ) Notice: Subject to any disclaimer, the term of this patent is extended or adjusted under 35 U.S.C. 154(b) by 27 days.

(21) Appl. No.: 16/682,978

(22) Filed: Nov. 13, 2019

(65) Prior Publication Data

US 2020/0153401 A1 May 14, 2020

(30) Foreign Application Priority Data

Nov. 14, 2018 (CN) .......................... 201811355480.8

(51) Int. Cl.
*H03G 3/00* (2006.01)
*H03G 3/30* (2006.01)
*H04R 3/00* (2006.01)

(52) U.S. Cl.
CPC ............. *H03G 3/3005* (2013.01); *H04R 3/00* (2013.01); *H04R 2430/01* (2013.01)

(58) Field of Classification Search
CPC ..... H03G 3/3005; H04R 3/00; H04R 2430/01
USPC .................................................. 381/107, 104
See application file for complete search history.

(56) References Cited

U.S. PATENT DOCUMENTS

| | | | |
|---|---|---|---|
| 5,255,325 | A | 10/1993 | Ishimitsu et al. |
| 5,468,266 | A | 11/1995 | Bensalem et al. |
| 5,595,577 | A | 1/1997 | Bensalem et al. |
| 7,460,678 | B2 | 12/2008 | Wei et al. |

(Continued)

FOREIGN PATENT DOCUMENTS

| | | |
|---|---|---|
| CN | 102158774 B | 12/2013 |
| EP | 0627174 A1 | 12/1994 |

(Continued)

OTHER PUBLICATIONS

First Taiwanese Office Action regarding Application No. 108139799 dated Sep. 25, 2020. English summary provided by Unitalen Attorneys at Law.

(Continued)

*Primary Examiner* — Ammar T Hamid
(74) *Attorney, Agent, or Firm* — Harness, Dickey & Pierce, P.L.C.

(57) ABSTRACT

A signal processing method, device and system are provided. A fitting amplitude of an input signal is acquired by performing fitting on the input signal according to a predetermined fitting model. A determination result about whether to apply a gain on the input signal is determined based on the fitting amplitude, and a gain signal is obtained based on the determination result. A delay signal acquired by delaying the input signal is processed based on the gain signal, to obtain an output signal. With the signal processing device and system, a simple structure and a small calculation amount are achieved, and the signal processing efficiency and the signal processing effect are improved.

17 Claims, 3 Drawing Sheets

(56) References Cited

U.S. PATENT DOCUMENTS

| | | |
|---|---|---|
| 7,656,975 B2 | 2/2010 | Tandon et al. |
| 7,839,949 B2 | 11/2010 | Hamada et al. |
| 7,940,198 B1 | 5/2011 | Velazquez |
| 8,315,398 B2 | 11/2012 | Katsianos |
| 8,520,770 B2 | 8/2013 | Ishikawa et al. |
| 8,577,047 B2 | 11/2013 | Gautama |
| 9,264,836 B2 | 2/2016 | Katsianos |
| 9,444,665 B2 | 9/2016 | Chou et al. |
| 9,497,530 B1 | 11/2016 | Campbell et al. |
| 9,794,672 B2 | 10/2017 | Campbell et al. |
| 10,154,333 B2 | 12/2018 | Campbell et al. |
| 2002/0027473 A1* | 3/2002 | Hatsugai ............... H03F 1/3288 330/149 |
| 2004/0068402 A1 | 4/2004 | Wei et al. |
| 2005/0276425 A1* | 12/2005 | Forrester ............... H04M 1/03 381/104 |
| 2009/0161883 A1 | 6/2009 | Katsianos |
| 2011/0182435 A1 | 7/2011 | Gautama |
| 2012/0250895 A1 | 10/2012 | Katsianos |
| 2016/0049915 A1* | 2/2016 | Wang ............... H03G 3/32 381/107 |
| 2017/0064434 A1 | 3/2017 | Campbell et al. |
| 2017/0347181 A1 | 11/2017 | Campbell et al. |

FOREIGN PATENT DOCUMENTS

| | | |
|---|---|---|
| EP | 1233509 A1 | 8/2002 |
| KR | 950000081 A | 1/1995 |
| KR | 20030075174 A | 9/2003 |
| KR | 20100099242 A | 9/2010 |
| KR | 20180044964 A | 5/2018 |

OTHER PUBLICATIONS

First Korean Office Action regarding Application No. 10-2019-0140590 dated May 13, 2021. English translation provided by Unitalen Attorneys at Law.

* cited by examiner

SIGNAL PROCESSING METHOD, SIGNAL PROCESSING DEVICE AND SIGNAL PROCESSING SYSTEM

The present application claims priority to Chinese Patent Application No. 201811355480.8, titled "SIGNAL PROCESSING METHOD, SIGNAL PROCESSING DEVICE AND SIGNAL PROCESSING SYSTEM", filed on Nov. 14, 2018 with the Chinese Patent Office, which is incorporated herein by reference in its entirety.

FIELD

The present disclosure relates to the field of information technology, and in particular to a signal processing method, a signal processing device and a signal processing system.

BACKGROUND

A basic framework for signal processing includes a driver and a driven element. Amplitude of a signal acceptable by the driven element varies with a frequency of the signal due to frequency response characteristics of the driven element. Therefore, a signal processing system is provided to process the signal.

In a conventional signal processing system, different control thresholds are set for different frequencies of the signal, that is, the thresholds are dynamically set for frequencies of an input signal. At present, a processing method based on frequency band division is generally used. With this method, the input signal is inputted to a frequency divider, the frequency divider divides the input signal into multiple signal segments by setting control thresholds for different frequencies of the input signal, where there is a one-to-one correspondence between the multiple signal segments and gain control modules. The multiple signal segments are processed by the respective gain control modules to obtain gain signals, and the gain signals are added to obtain a final signal.

However, in a case that the input signal is divided into too many signal segments by the frequency divider, the frequency divider may have a complicated structure, resulting in a low efficiency in signal processing. Further, if the input signal is divided by the frequency divider with a too small interval, the multiple signal segments may be affected from each other, which may result in a poor processing effect.

It can be seen from the above, the conventional signal processing system for signal processing with a frequency divider has a complicated structure, a low signal processing efficiency, and a poor signal processing effect.

SUMMARY

In view of this, a signal processing method, a signal processing device and a signal processing system are provided according to embodiments of the present disclosure, to improve signal processing efficiency and signal processing effect, and to simplify a structure of the conventional signal processing system.

In a first aspect of the present disclosure, a signal processing method is provided, which is applied to a signal processing device. The signal processing device, a driver and a driven element form a signal processing system. The method includes: acquiring a fitting amplitude by performing fitting on an input signal according to a fitting model, where the fitting model is predetermined; determining, based on the fitting amplitude, whether to apply a gain on the input signal, and acquiring a gain signal based on a determination result; acquiring a delay signal by delaying the input signal by a predetermined time period, where the predetermined time period is identical to a time period for obtaining the gain signal; and processing the delay signal based on the gain signal, to obtain a gain output signal.

In an embodiment, the fitting model is predetermined by performing steps of: acquiring a frequency response curve of the driven element; and performing fitting on the frequency response curve, to establish the fitting model. The fitting model includes a transfer function for performing fitting on the frequency response curve.

In an embodiment, the acquiring a fitting amplitude by performing fitting on an input signal according to a fitting model includes: performing fitting on the input signal with a transfer function in the fitting model to obtain the fitting amplitude, wherein the input signal serves as an input to the transfer function, and the transfer function comprises a linear approximation function or a least square function.

In an embodiment, the determining, based on the fitting amplitude, whether to apply a gain on the input signal and acquiring a gain signal includes: determining whether the fitting amplitude is greater than a preset threshold; determining, in a case that the fitting amplitude is greater than the preset threshold, to apply an attenuation gain on the input signal; and decreasing, if it is determined to apply the attenuation gain on the input signal, the fitting amplitude of the input signal until the fitting amplitude is less than the preset threshold, and obtaining the gain signal.

In a second aspect of the present disclosure, a signal processing device is provided. The signal processing device includes: a multiplier, a first branch including a delayer; and a second branch including a fitting module and a gain calculating module connected in series. The fitting module is configured to perform fitting on an input signal inputted to the fitting module according to a fitting model to obtain a fitting amplitude, and transmit the fitting amplitude to the gain calculating module connected in series with the fitting module. The gain calculating module is configured to determine, based on the fitting amplitude, whether to apply a gain on the input signal, acquire a gain signal based on a determination result, and transmit the gain signal to the multiplier as one input of the multiplier. The delayer is configured to delay the input signal inputted to the delayer by a predetermined time period to obtain a delay signal, and transmit the delay signal to the multiplier as another input of the multiplier, where the predetermined time period is identical to a time period for obtaining the gain signal. The multiplier is configured to process the delay signal based on the gain signal, to obtain a gain output signal.

In an embodiment, the signal processing device further includes a processor. The processor is configured to acquire a frequency response curve of a driven element, and perform fitting on the frequency response curve to establish the fitting model. The fitting model includes a transfer function for performing fitting on the frequency response curve.

In an embodiment, the fitting model includes a transfer function. The transfer function is configured to perform fitting on the input signal, to obtain the fitting amplitude. The input signal serves as an input of the transfer function, and the transfer function includes a linear approximation function or a least square function.

In an embodiment, the gain calculating module includes a comparator and a gain adjusting module. The comparator is configured to determine whether the fitting amplitude is greater than a preset threshold, determine to apply an attenuation gain on the input signal in a case that the fitting amplitude is greater than the preset threshold, and determine to apply no gain on the input signal in a case that the fitting amplitude is less than the preset threshold. The gain adjusting module is configured to decrease, if it is determined to apply the attenuation gain on the input signal, the fitting amplitude of the input signal until the fitting amplitude is less than the preset threshold, to obtain the gain signal.

In a third aspect of the present disclosure, a signal processing system is provided. The signal processing system includes the signal processing device according to the second aspect of the present disclosure, a driver and a driven element. The signal processing device, the driver and the driven element are connected successively in series.

With the above signal processing method, signal processing device and signal processing system according to embodiments of the present disclosure, the fitting model is established by performing fitting on the frequency response curve, the gain calculating module determines whether to apply a gain on the fitting amplitude acquired according to the fitting model, acquires the gain signal based on the determination result. The delay signal is processed based on the gain signal to obtain the output signal, such that the output signal conforms to characteristics of a driven element and a high accuracy can be achieved. With the above signal processing method, signal processing device and signal processing system according to embodiments of the present disclosure, a simple structure and a small calculation amount are achieved, and the signal processing efficiency and the signal processing effect are improved.

BRIEF DESCRIPTION OF THE DRAWINGS

In order to more clearly describe the technical solutions in the embodiments of the present disclosure or the technical solutions in the conventional technology, drawings to be used in the description of the embodiments of the present disclosure or the conventional technology are briefly described hereinafter. It is apparent that the drawings described below show merely the embodiments of the present disclosure, and those skilled in the art may obtain other drawings according to the provided drawings without any creative effort.

DETAILED DESCRIPTION OF EMBODIMENTS

Technical solutions of embodiments of the present disclosure are clearly and completely described below in conjunction with the drawings of the embodiments of the present disclosure. Apparently, the embodiments described in the following are only some embodiments of the present disclosure, rather than all the embodiments. Any other embodiments obtained by those skilled in the art based on the embodiments in the present disclosure without any creative effort fall within the protection scope of the present disclosure.

In this specification, terms of "include", "comprise" or any other variants are intended to be non-exclusive. Therefore, a process, method, article or device including multiple elements includes not only the elements but also other elements that are not enumerated, or also include the elements inherent for the process, method, article or device. Unless expressively limited otherwise, the statement "comprising (including) one . . . " does not exclude the case that other similar elements may exist in the process, method, article or device.

First Embodiment

Figure 1:
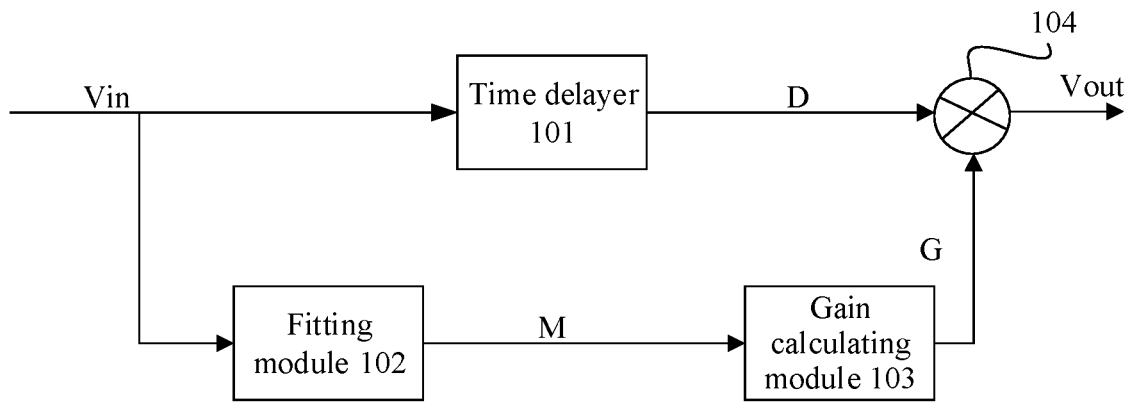
FIG. 1 is a schematic block diagram showing a signal processing device according to an embodiment of the present disclosure.

Reference is made to FIG. 1, which is a schematic structural diagram showing a signal processing device according to an embodiment of the present disclosure. The signal processing device includes a delayer 101, a fitting module 102, a gain calculating module 103, and a multiplier 104.

The delayer 101 forms a first branch. The fitting module 102 and the gain calculating module 103 are connected in series, to form a second branch. An output of the first branch serves as one input of the multiplier 104, and an output of the second branch serves as another input of the multiplier 104.

The delayer 101 is configured to delay an input signal Vin inputted to the first branch by a predetermined time period to obtain a delay signal D, and transmit the delay signal D to an input terminal of the multiplier 104. The predetermined time period is identical to a time period for obtaining a gain signal G based on the input signal Vin with the second branch.

The fitting module 102 is configured to perform fitting on the input signal Vin inputted to the second branch according to a fitting model, to obtain a fitting amplitude M, and transmit the fitting amplitude M to the gain calculating module 103 connected in series with the fitting module 102. The gain calculating module 103 is configured to determine, based on the fitting amplitude M, whether to apply a gain on the input signal Vin, acquire a gain signal G based on a determination result, and transmit the gain signal G to the multiplier 104 as an input of the multiplier 104. The multiplier 104 is configured to process the delay signal D outputted from the first branch based on the gain signal G outputted from the second branch, to obtain an output signal Vout.

Figure 2:
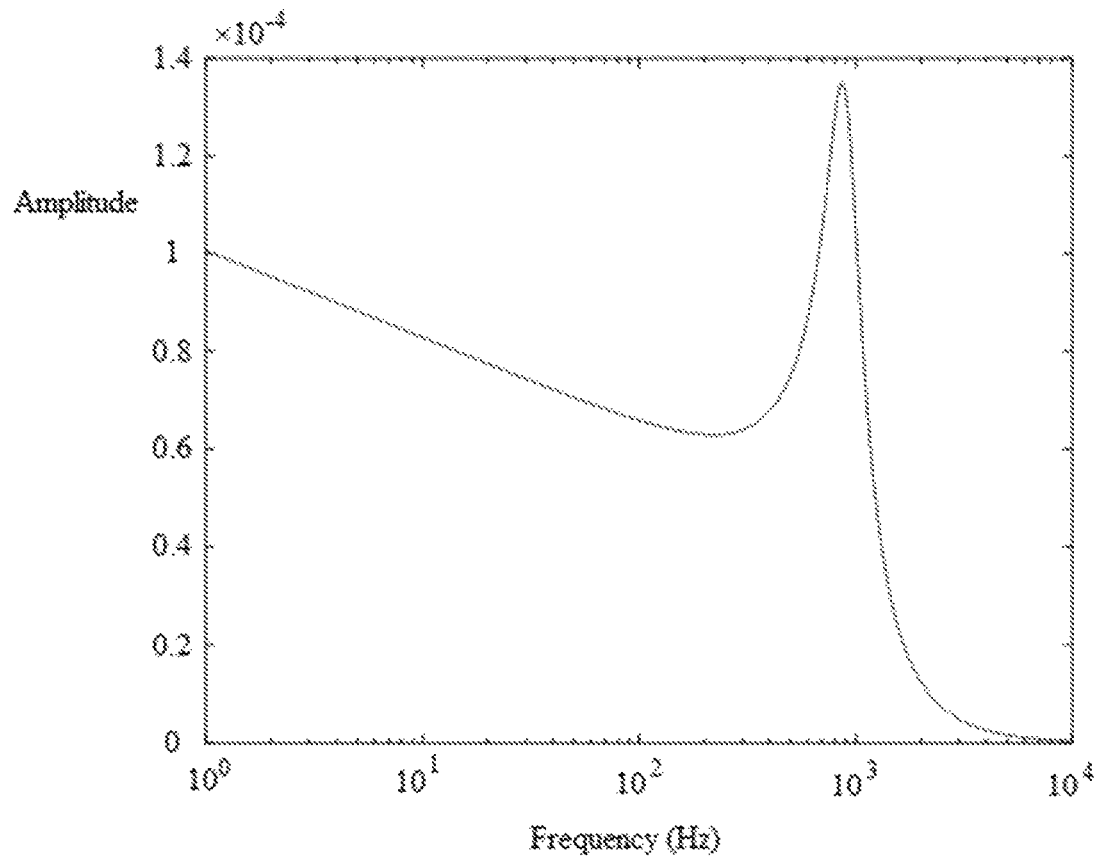
FIG. 2 is a schematic diagram showing a frequency response curve of a driven element according to an embodiment of the present disclosure.

With the signal processing device according to the above embodiment of the present disclosure, the fitting model described above is determined in advance based on a frequency response curve of a driven element. Reference is made to FIG. 2, which shows a frequency response curve of a driven element, where an abscissa denotes a frequency with a unit of Hz, and an ordinate denotes an amplitude of an output signal of the driven element, which may be defined depending on a type of the driven element and characteristics focused by those skilled in the art, such as a voltage, a circuit or a shift.

In an embodiment, the signal processing device further includes a processor. The processor is configured to acquire the frequency response curve of the driven element, and perform fitting on the frequency response curve, to establish the fitting model.

In an embodiment, the fitting model includes a transfer function for performing fitting on the frequency response curve.

In an embodiment, the transfer function may be, but is not limited to, a linear approximation function or a least square function.

In a specific implementation, the input signal inputted to the fitting model serves as an input of the transfer function, and the transfer function is used, by the fitting module 102 for performing fitting on the input signal, to obtain the fitting amplitude.

In the embodiments of the present disclosure, the predetermined fitting model is used for performing fitting on the input signal, to obtain the fitting amplitude. The gain calculating module determines, based on the fitting amplitude, whether to apply a gain on the input signal, perform a process based on a determination result to obtain a gain signal. A delay signal obtained by delaying the input signal by a predetermined time period is processed based on the gain signal, to obtain an output signal, such that the output signal conforms to characteristics of a driven element, and a high accuracy can be achieved. With the above signal processing device according to the embodiments of the present disclosure, a simple structure and a small calculation amount are achieved, and the signal processing efficiency and the signal processing effect are improved.

Second Embodiment

Figure 3:
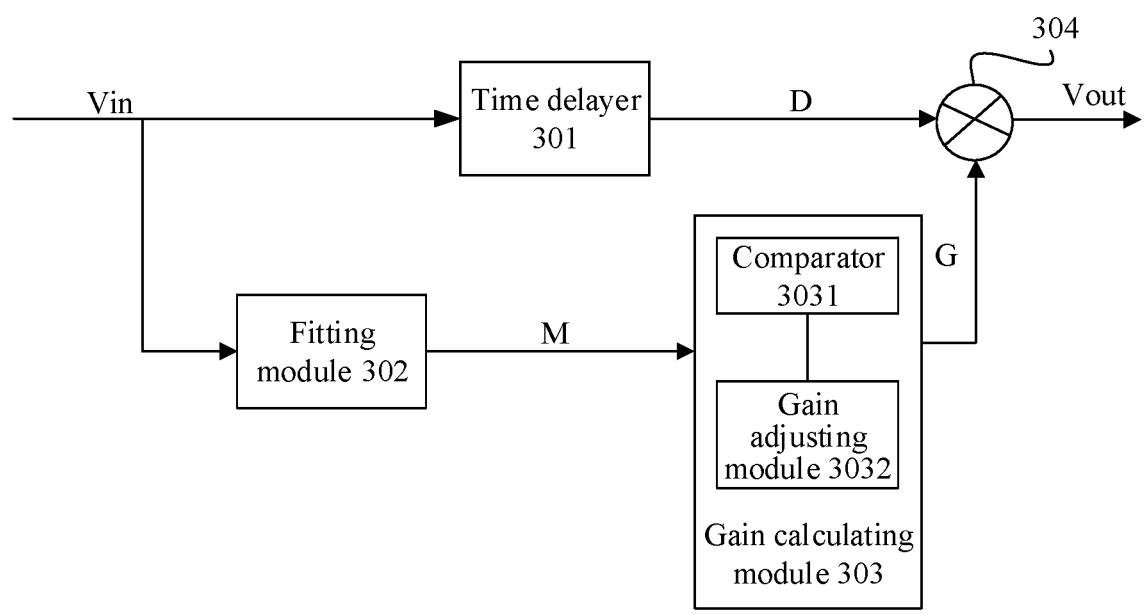
FIG. 3 is a schematic structural diagram showing a gain calculating module according to an embodiment of the present disclosure.

Reference is made to FIG. 3 in combination with FIG. 1, the gain calculating module shown in FIG. 1 includes a comparator 3031 and a gain adjusting module 3032.

The comparator 3031 is configured to determine whether a fitting amplitude M is greater than a preset threshold. In a case that the fitting amplitude M is greater than the preset threshold, it is determined to apply an attenuation gain on the input signal. In a case that the fitting amplitude M is less than the preset threshold, it is determined to apply no gain on the input signal.

The gain adjusting module 3032 is configured to decrease, if it is determined to apply the attenuation gain on the input signal by the comparator 3031, the fitting amplitude M of the input signal until the fitting amplitude M is less than the preset threshold, to obtain a gain signal G.

In combination with the signal processing device shown in FIG. 1 and FIG. 3, a calculating process of the gain adjusting module 303 for the gain is described in detail below by taking the preset threshold of a value of 5 as an example.

In a case that the fitting amplitude M calculated by the fitting module 302 according to a fitting model is equal to a value of 4, the comparator 3031 compares the fitting amplitude M with the preset threshold. Since the fitting amplitude of the value of 4 is less than the preset threshold of the value of 5, it is determined to apply no gain on the input signal.

In a case that the fitting amplitude M calculated by the fitting module 302 according to the fitting model is equal to a value of 7, the comparator 3031 compares the fitting amplitude M with the preset threshold. Since the fitting amplitude of the value of 7 is greater than the preset threshold of the value of 5, it is determined to apply an attenuation gain on the input signal. The gain adjusting module 3032 decreases, if it is determined to apply the attenuation gain on the input signal by the comparator 3031, the fitting amplitude M of the input signal until the fitting amplitude M is less than the preset threshold, to obtain the gain signal G.

In the embodiment of the present disclosure, the fitting model is used for performing fitting on the input signal, to obtain the fitting amplitude. The gain calculating module determines, based on the fitting amplitude, whether to apply a gain on the input signal, perform a process based on a determination result to obtain a gain signal. A delay signal obtained by delaying the input signal by a predetermined time period is processed based on the gain signal, to obtain an output signal, such that the output signal conforms to characteristics of a driven element, and a high accuracy can be achieved. With the above signal processing device according to the embodiments of the present disclosure, a simple structure and a small calculation amount are achieved, and the signal processing efficiency and the signal processing effect are improved.

Third Embodiment

Figure 4:
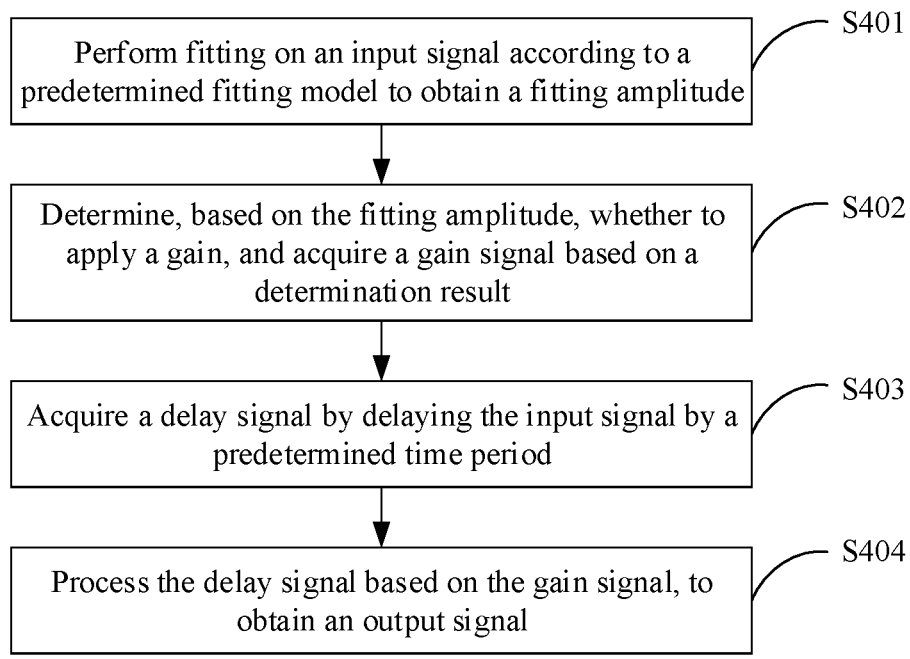
FIG. 4 is a schematic flowchart showing a signal processing method according to an embodiment of the present disclosure.

Based on the signal processing device disclosed in the above first embodiment and second embodiment of the present disclosure, a signal processing method is further provided according to the present disclosure, which is applied to the signal processing device. Reference is made to FIG. 4, which is a schematic flowchart showing a signal processing method according to the embodiment of the present disclosure. The method includes the following steps S401 to S404.

In step S401, a fitting amplitude M is acquired by performing fitting on an input signal Vin according to a predetermined fitting model.

The fitting model in step S401 is determined in advance. The fitting model is predetermined as follows. Firstly, a frequency response curve of a driven element is acquired. Next, fitting is performed on the frequency response curve, to establish the fitting model. The fitting model includes a transfer function for performing fitting on the frequency response curve.

In step S402, it is determined, based on the fitting amplitude M, whether to apply a gain on the input signal Vin, and a gain signal G is obtained based on a determination result.

The process of determining, based on the fitting amplitude M, whether to apply a gain on the input signal Vin, and acquiring a gain signal G based on a determination result in step 402 are performed specifically includes as follows. Firstly, it is determined whether the fitting amplitude is greater than a preset threshold. Secondly, in a case that the fitting amplitude is greater than the preset threshold, it is determined to apply an attenuation gain on the input signal. Thirdly, if it is determined to apply the attenuation gain on the input signal, the fitting amplitude of the input signal is decreased until the fitting amplitude is less than the preset threshold, to obtain the gain signal. Finally, in a case that the fitting amplitude is less than the preset threshold, it is determined to apply no gain on the input signal.

In step S403, a delay signal D is acquired by delaying the input signal Vin by a predetermined time period.

In step S403, the predetermined time period is identical to a time period for obtaining the gain signal G based on the input signal Vin, such that the delay signal D synchronizes with the gain signal G.

In step S404, the delay signal D is processed based on the gain signal to obtain a gain output signal Vout.

In step S404, the delay signal D is processed based on the gain signal G according to the following equation (1).

$$V\text{out} = G*D \tag{1}$$

where Vout denotes a gain output signal, G denotes a gain signal, and D denotes a delay signal.

In practice, the delay signal D may be processed based on the gain signal G with a multiplier. However, the present disclosure is not limited thereto, any device having the same function as the multiplier may be used to perform the process.

In the embodiment of the present disclosure, the predetermined fitting model is used for performing fitting on the input signal, to obtain the fitting amplitude. The gain calculating module determines, based on the fitting amplitude, whether to apply a gain on the input signal, perform a process based on a determination result to obtain a gain signal. A delay signal obtained by delaying the input signal by a predetermined time period is processed based on the gain signal, to obtain an output signal, such that the output signal conforms to characteristics of a driven element, and a high accuracy can be achieved. With the above signal processing device according to the embodiments of the present disclosure, a simple structure and a small calculation amount are achieved, and the signal processing efficiency and the signal processing effect are improved.

Fourth Embodiment

Figure 5:
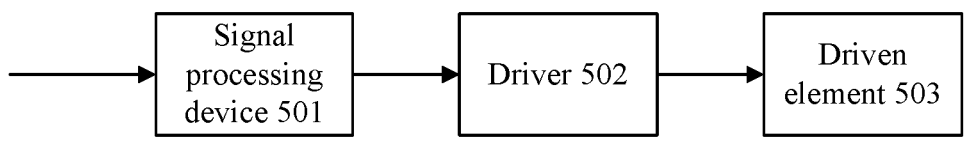
FIG. 5 is a schematic diagram showing a signal processing system according to an embodiment of the present disclosure.

A signal processing system is further provided according to the present disclosure. Reference is made to FIG. 5, which shows a signal processing system according to the embodiment of the present disclosure. The signal processing system includes a signal processing device 501, a driver 502 and a driven element 503. The signal processing device 501 may be the signal processing device disclosed in any one of the first embodiment and the second embodiment of the present disclosure. Operation principles of the signal processing device 501 are identical to that of the signal processing device disclosed in any one of the first embodiment and the second embodiment of the present disclosure, which are not repeated herein.

Based on the signal processing device according to the first embodiment and the second embodiment of the present discourse and the signal processing method according to the third embodiment of the present discourse, and in combination with FIG. 1 and FIG. 3, the signal processing system shown in FIG. 5 process a signal as follows.

Firstly, a frequency response curve of the driven element 503 is acquired, and fitting is performed on the frequency response curve of the driven element 503, to establish a fitting model.

In a case that an input signal Vin is inputted to a first branch formed by a delayer 101, the delayer 101 delays the input signal Vin by a predetermined time period, to obtain a delay signal D, and transmits the delay signal D to an input terminal of a multiplier 104.

In a case that the input signal Vin is inputted to a second branch formed by the fitting module 102 and a gain calculating module 103, the fitting module 102 acquires the input signal Vin, and performs fitting on the input signal Vin according to a transfer function in a fitting model, to obtain a fitting amplitude M, and transmits the fitting amplitude M to the gain calculating module 103.

The gain calculating module 103 determines, based on the fitting amplitude M, whether to apply a gain on the input signal Vin, acquires a gain signal G based on a determination result, and transmits the gain signal G to another input terminal of the multiplier 104.

The multiplier 104 processes the delay signal D based on the gain signal G to obtain a gain output signal Vout, and transmits the gain output signal Vout to the driver 502.

The driver 502 acquires the gain output signal Vout, and performs a driving operation in response to the gain output signal Vout.

The driven element 503 operates under the driving operation of the driver 502.

In the embodiment of the present disclosure, the predetermined fitting model is used for performing fitting on the input signal, to obtain the fitting amplitude. The gain calculating module determines, based on the fitting amplitude, whether to apply a gain on the input signal, perform a process based on a determination result to obtain a gain signal. A delay signal obtained by delaying the input signal by a predetermined time period is processed based on the gain signal, to obtain an output signal, such that the output signal conforms to characteristics of a driven element, and a high accuracy can be achieved. With the above signal processing device according to the embodiments of the present disclosure, a simple structure and a small calculation amount are achieved, and the signal processing efficiency and the signal processing effect are improved.

The embodiments in this specification are described in a progressive way, each of which emphasizes the differences from others, and the same or similar parts among the embodiments can be referred to each other. Since the system disclosed in the embodiments is basically similar to the method therein, the description thereof is relatively simple, and for relevant matters references may be made to the description of the method. The system and embodiments of the system described in the above are merely illustrative. Units described as separate components may be or may not be physically separated. Components shown as units may be or may not be physical units, that is, may be located in one location or may be distributed in multiple network units. Parts or all of the modules may be selected based on actual conditions, to implement the technical solutions of the present disclosure. Those skilled in the art can understand and carry out the present disclosure without any creative effort.

It is to be further understood by those skilled in the art that units described in combination with the disclosed embodiments may be implemented by electronic hardware, computer software or a combination thereof. In order to clearly describe interchangeability of the hardware and the software, the units are generally described above based on functions. Whether the functions are realized by the hardware or the software is determined by specific applications of the technical solutions and design constraints. For each of the specific applications, those skilled in the art may adopt a specific implementation to realize the functions described above, and the implementation should fall within the scope of the present disclosure.

With the description of the embodiments disclosed above, those skilled in the art may implement or use technical solutions of the present disclosure. Numerous modifications to the embodiments are apparent to those skilled in the art, and the general principles defined herein may be implemented in other embodiments without departing from the spirit or scope of the present disclosure. Therefore, the present disclosure may not be limited to the embodiments described herein, but should comply with the widest scope consistent with the principles and novel features disclosed herein.

The invention claimed is:

1. A signal processing method, comprising:
acquiring a fitting amplitude by performing fitting on an input signal according to a fitting model, wherein the fitting model is predetermined;
determining, based on the fitting amplitude, whether to apply a gain on the input signal, and acquiring a gain signal based on a determination result;
acquiring a delay signal by delaying the input signal by a predetermined time period, wherein the predetermined time period is identical to a time period for obtaining the gain signal; and
processing the delay signal based on the gain signal, to obtain a gain output signal,
wherein the fitting model is predetermined by performing steps of:
acquiring a frequency response curve of a driven element; and
performing fitting on the frequency response curve, to establish the fitting model, wherein the fitting model comprises a transfer function for performing fitting on the frequency response curve.

2. The method according to claim 1, wherein the acquiring a fitting amplitude by performing fitting on an input signal according to a fitting model comprises:
performing fitting on the input signal with a transfer function in the fitting model to obtain the fitting amplitude, wherein the input signal serves as an input to the transfer function, and the transfer function is a linear approximation function or a least square function.

3. The method according to claim 1, wherein the determining, based on the fitting amplitude, whether to apply a gain on the input signal and acquiring a gain signal based on a determination result, comprises:
determining whether the fitting amplitude is greater than a preset threshold;
determining, in a case that the fitting amplitude is greater than the preset threshold, to apply an attenuation gain on the input signal; and
decreasing, if it is determined to apply the attenuation gain on the input signal, the fitting amplitude of the input signal until the fitting amplitude is less than the preset threshold, and obtaining the gain signal.

4. The method according to claim 1, wherein the determining, based on the fitting amplitude, whether to apply a gain on the input signal and acquiring a gain signal based on a determination result, comprises:
determining whether the fitting amplitude is greater than a preset threshold;
determining, in a case that the fitting amplitude is greater than the preset threshold, to apply an attenuation gain on the input signal; and
decreasing, if it is determined to apply the attenuation gain on the input signal, the fitting amplitude of the input signal until the fitting amplitude is less than the preset threshold, and obtaining the gain signal.

5. The method according to claim 2, wherein the determining, based on the fitting amplitude, whether to apply a gain on the input signal and acquiring a gain signal based on a determination result, comprises:
determining whether the fitting amplitude is greater than a preset threshold;
determining, in a case that the fitting amplitude is greater than the preset threshold, to apply an attenuation gain on the input signal; and
decreasing, if it is determined to apply the attenuation gain on the input signal, the fitting amplitude of the input signal until the fitting amplitude is less than the preset threshold, and obtaining the gain signal.

6. The method according to claim 1, wherein the method is applied to a signal processing device, and wherein a signal processing system comprises the signal processing device, a driver and a driven element.

7. A signal processing device, comprising:
a multiplier;
a first branch comprising a delayer; and
a second branch comprising a fitting module and a gain calculating module connected in series, wherein
the fitting module is configured to perform fitting on an input signal inputted to the fitting module according to a fitting model, to obtain a fitting amplitude, and transmit the fitting amplitude to the gain calculating module connected in series with the fitting module;
the gain calculating module is configured to determine, based on the fitting amplitude, whether to apply a gain on the input signal, acquire a gain signal based on a determination result, and transmit the gain signal to the multiplier as one input of the multiplier;
the delayer is configured to delay the input signal inputted to the delayer by a predetermined time period to obtain a delay signal, and transmit the delay signal to the multiplier as another input of the multiplier, wherein the predetermined time period is identical to a time period for obtaining the gain signal; and
the multiplier is configured to process the delay signal based on the gain signal, to obtain a gain output signal,
the signal processing device further comprising:
a processor configured to acquire a frequency response curve of a driven element, and perform fitting on the frequency response curve to establish the fitting model, wherein the fitting model comprises a transfer function for performing fitting on the frequency response curve.

8. The signal processing device according to claim 7, wherein the fitting model comprises a transfer function configured to perform fitting on the input signal, to obtain the fitting amplitude, wherein the input signal serves as an input of the transfer function, and the transfer function is a linear approximation function or a least square function.

9. The signal processing device according to claim 7, wherein the gain calculating module comprises:
a comparator configured to: determine whether the fitting amplitude is greater than a preset threshold, determine to apply an attenuation gain on the input signal in a case that the fitting amplitude is greater than the preset threshold, and determine to apply no gain on the input signal in a case that the fitting amplitude is less than the preset threshold; and
a gain adjusting module configured to decrease, if it is determined to apply the attenuation gain on the input signal, the fitting amplitude of the input signal until the fitting amplitude is less than the preset threshold, to obtain the gain signal.

10. The signal processing device according to claim 7, wherein the gain calculating module comprises:
a comparator configured to: determine whether the fitting amplitude is greater than a preset threshold, determine to apply an attenuation gain on the input signal in a case that the fitting amplitude is greater than the preset threshold, and determine to apply no gain on the input signal in a case that the fitting amplitude is less than the preset threshold; and
a gain adjusting module configured to decrease, if it is determined to apply the attenuation gain on the input signal, the fitting amplitude of the input signal until the fitting amplitude is less than the preset threshold, to obtain the gain signal.

11. The signal processing device according to claim 8, wherein the gain calculating module comprises:
a comparator configured to: determine whether the fitting amplitude is greater than a preset threshold, determine to apply an attenuation gain on the input signal in a case that the fitting amplitude is greater than the preset threshold, and determine to apply no gain on the input signal in a case that the fitting amplitude is less than the preset threshold; and
a gain adjusting module configured to decrease, if it is determined to apply the attenuation gain on the input signal, the fitting amplitude of the input signal until the fitting amplitude is less than the preset threshold, to obtain the gain signal.

12. A signal processing system, comprising: a signal processing device, a driver and a driven element, wherein
the signal processing device comprises: a multiplier; a first branch comprising a delayer; and a second branch comprising a fitting module and a gain calculating module, and wherein
the fitting module is configured to perform fitting on an input signal inputted to the fitting module according to a fitting model, to obtain a fitting amplitude, and transmit the fitting amplitude to the gain calculating module connected in series with the fitting module;
the gain calculating module is configured to determine, based on the fitting amplitude, whether to apply a gain on the input signal, acquire a gain signal based on a determination result, and transmit the gain signal to the multiplier as one input of the multiplier;
the delayer is configured to delay the input signal inputted to the delayer by a predetermined time period to obtain a delay signal, and transmit the delay signal to the multiplier as another input of the multiplier, wherein the predetermined time period is identical to a time period for obtaining the gain signal; and
the multiplier is configured to process the delay signal based on the gain signal, to obtain a gain output signal, and
wherein the signal processing device, the driver and the driven element are connected successively in series,
the signal processing system further comprising:
a processor configured to acquire a frequency response curve of a driven element, and perform fitting on the frequency response curve to establish the fitting model, wherein the fitting model comprises a transfer function for performing fitting on the frequency response curve.

13. The signal processing system according to claim 12, wherein the fitting model comprises a transfer function configured to perform fitting on the input signal, to obtain the fitting amplitude, wherein the input signal serves as an input of the transfer function, and the transfer function comprises a linear approximation function or a least square function.

14. The signal processing system according to claim 12, wherein the gain calculating module comprises:
a comparator configured to: determine whether the fitting amplitude is greater than a preset threshold, determine to apply an attenuation gain on the input signal in a case that the fitting amplitude is greater than the preset threshold, and determine to apply no gain on the input signal in a case that the fitting amplitude is less than the preset threshold; and
a gain adjusting module configured to decrease, if it is determined to apply the attenuation gain on the input signal, the fitting amplitude of the input signal until the fitting amplitude is less than the preset threshold, to obtain the gain signal.

15. The signal processing system according to claim 12, wherein the gain calculating module comprises:
a comparator configured to: determine whether the fitting amplitude is greater than a preset threshold, determine to apply an attenuation gain on the input signal in a case that the fitting amplitude is greater than the preset threshold, and determine to apply no gain on the input signal in a case that the fitting amplitude is less than the preset threshold; and
a gain adjusting module configured to decrease, if it is determined to apply the attenuation gain on the input signal, the fitting amplitude of the input signal until the fitting amplitude is less than the preset threshold, to obtain the gain signal.

16. The signal processing system according to claim 13, wherein the gain calculating module comprises:
a comparator configured to: determine whether the fitting amplitude is greater than a preset threshold, determine to apply an attenuation gain on the input signal in a case that the fitting amplitude is greater than the preset threshold, and determine to apply no gain on the input signal in a case that the fitting amplitude is less than the preset threshold; and
a gain adjusting module configured to decrease, if it is determined to apply the attenuation gain on the input signal, the fitting amplitude of the input signal until the fitting amplitude is less than the preset threshold, to obtain the gain signal.

17. The signal processing system according to claim 12, wherein
the driver is configured to acquire the gain output signal, and perform a driving operation in response to the gain output signal; and
the driven element is configured to operate under the driving operation of the driver.

* * * * *